(12) United States Patent
Zweering et al.

(10) Patent No.: US 10,761,436 B2
(45) Date of Patent: Sep. 1, 2020

(54) OPTICAL ARRANGEMENT, IN PARTICULAR LITHOGRAPHY SYSTEM, WITH A TRANSPORT LOCK

(71) Applicant: Carl Zeiss SMT GmbH, Oberkochen (DE)

(72) Inventors: Ralf Zweering, Aalen (DE); Steffen Fritzsche, Aalen (DE); Hendrik Wagner, Aalen (DE); Florian Ahles, Aalen (DE); Jens Prochnau, Oberkochen (DE); Michael Erath, Dietenheim (DE); Viktor Kulitzki, Zwickau (DE); Marwène Nefzi, Ulm (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 16/511,154

(22) Filed: Jul. 15, 2019

(65) Prior Publication Data
US 2019/0339625 A1  Nov. 7, 2019

Related U.S. Application Data

(63) Continuation of application No. PCT/EP2017/083836, filed on Dec. 20, 2017.

(30) Foreign Application Priority Data

Jan. 17, 2017 (DE) .................. 10 2017 200 636

(51) Int. Cl.
*G03F 7/20* (2006.01)
*G02B 7/02* (2006.01)

(52) U.S. Cl.
CPC ......... *G03F 7/70825* (2013.01); *G02B 7/023* (2013.01); *G03F 7/2002* (2013.01); *G03F 7/70033* (2013.01)

(58) Field of Classification Search
CPC ............................ G03F 7/707; G03F 7/70825
(Continued)

(56) References Cited

U.S. PATENT DOCUMENTS 6,172,738 B1 * 1/2001 Korenaga ........... G03F 7/70358
                                                        355/53
6,722,167 B1    4/2004 Hsu
(Continued)

FOREIGN PATENT DOCUMENTS

DE       10121347 A1    11/2002
DE    102007017589 B3    10/2008
(Continued)

OTHER PUBLICATIONS

International Search Report for corresponding PCT/EP2017/083836 dated Mar. 28, 2018.
(Continued)

*Primary Examiner* — Hung Nguyen
(74) *Attorney, Agent, or Firm* — Fish & Richardson P.C.

(57) ABSTRACT

An optical arrangement, for example a lithography system, includes: a first component, in particular a carrying frame; a second component, in particular a mirror, which is movable in relation to the first component; and at least one stop with at least one stop face for limiting the movement of the second component in relation to the first component. The optical arrangement, preferably the stop, can have a fixing device for fixing the second component. The fixing device can have a fixing element that is movable in relation to the stop face of the stop. Further aspects of the device likewise relate to an optical arrangement with a fixing device or with a transport lock.

20 Claims, 5 Drawing Sheets

(58) Field of Classification Search
USPC .................................................. 355/53, 67
See application file for complete search history.

(56) References Cited

U.S. PATENT DOCUMENTS

| | | | | |
|---|---|---|---|---|
| 7,394,526 | B2* | 7/2008 | Shibazaki | G03F 7/707 355/72 |
| 8,355,218 | B2 | 1/2013 | Imanishi | |
| 2007/0062398 | A1 | 3/2007 | Butler | |
| 2010/0134770 | A1 | 6/2010 | Okamoto | |
| 2010/0193304 | A1 | 8/2010 | Böse et al. | |
| 2013/0314681 | A1 | 11/2013 | Erath et al. | |
| 2014/0021324 | A1 | 1/2014 | Schumacher et al. | |
| 2016/0077441 | A1 | 3/2016 | Kugler et al. | |
| 2017/0357164 | A1 | 12/2017 | Prochnau et al. | |

FOREIGN PATENT DOCUMENTS

| | | |
|---|---|---|
| DE | 102011004607 A1 | 1/2012 |
| DE | 102011087389 A1 | 7/2012 |
| DE | 102011088251 A1 | 6/2013 |
| DE | 102012201029 A1 | 7/2013 |
| DE | 102012212503 A1 | 1/2014 |
| DE | 102014215159 A1 | 9/2014 |
| DE | 102013211310 A1 | 12/2014 |
| DE | 102015201249 A1 | 7/2016 |
| EP | 1500985 A2 | 1/2005 |
| GB | 2267947 A | 12/1993 |
| JP | H11-159571 | 6/1999 |
| WO | WO 2013/110536 A1 | 8/2013 |
| WO | WO 2015/118137 A1 | 8/2015 |

OTHER PUBLICATIONS

German Office Action, with translation thereof, for corresponding Appl No. 10 2017 200 636.6, dated Aug. 2, 2017.

\* cited by examiner

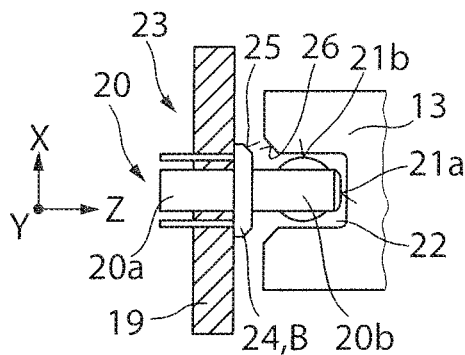
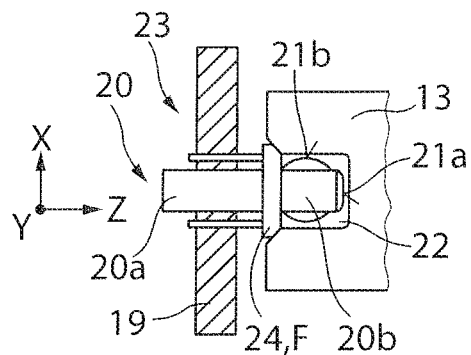
Fig. 2A  Fig. 2B
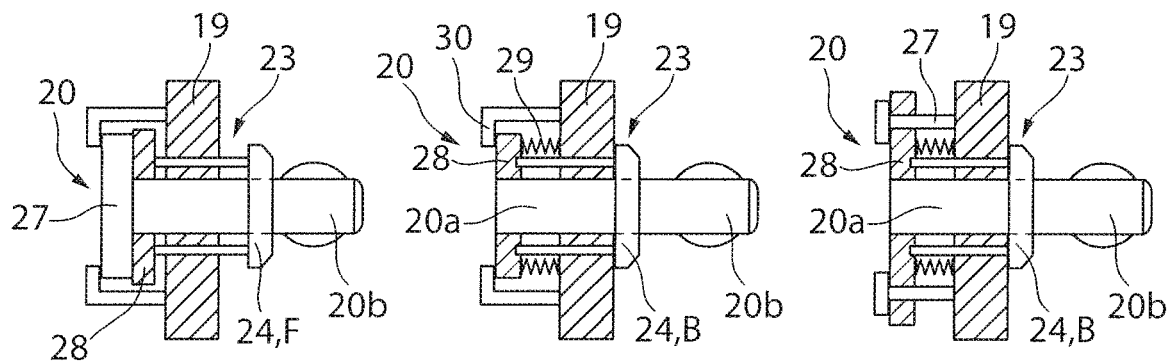
Fig. 3A  Fig. 3B  Fig. 3C
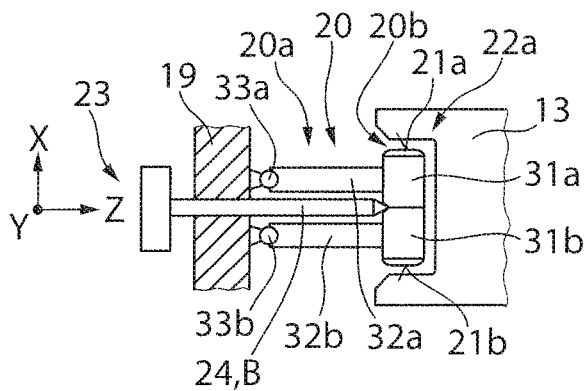
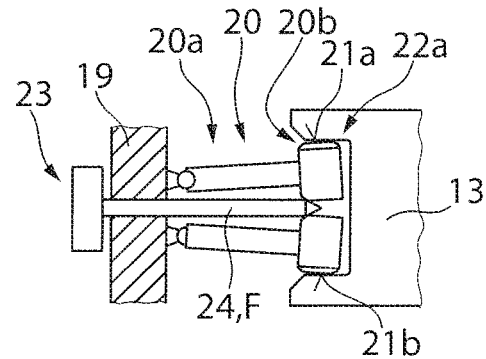
Fig. 4A  Fig. 4B

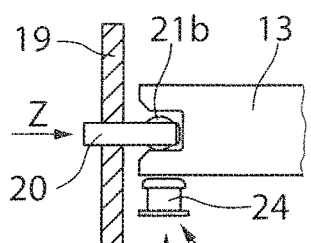
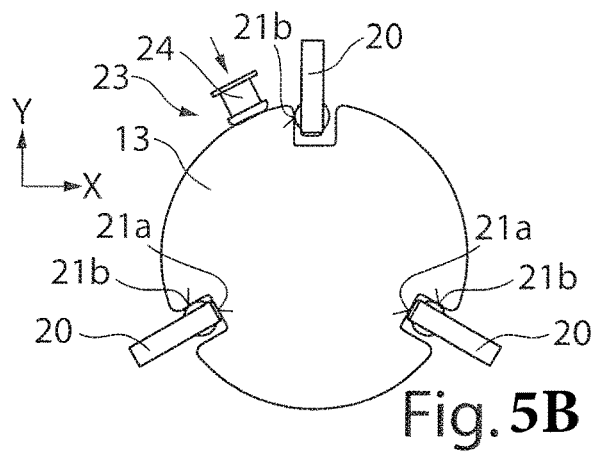
Fig. 5A    Fig. 5B
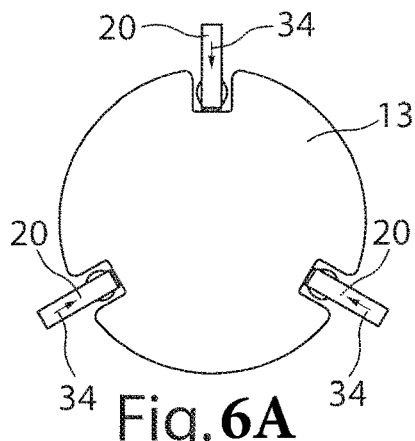
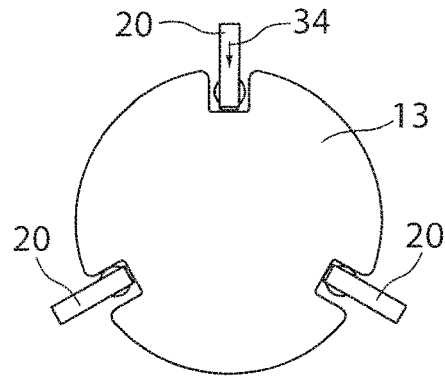
Fig. 6A    Fig. 6B
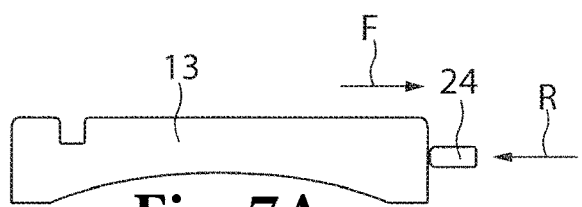
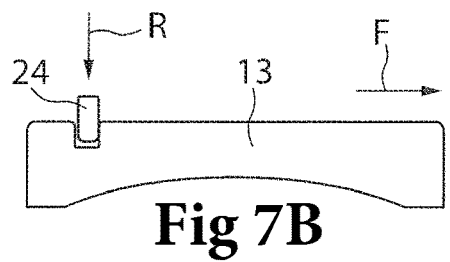
Fig. 7A    Fig 7B
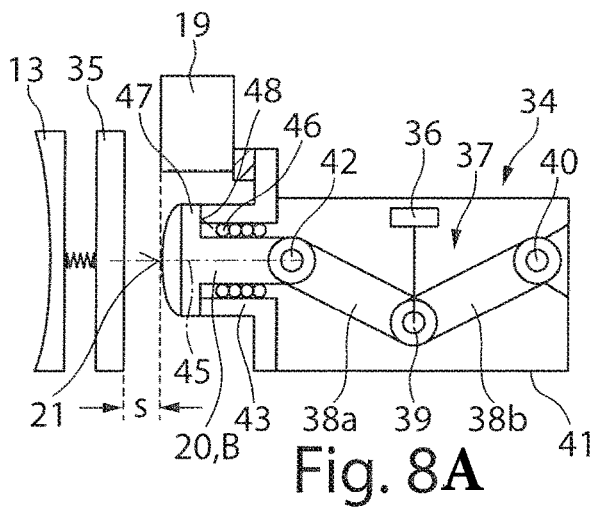
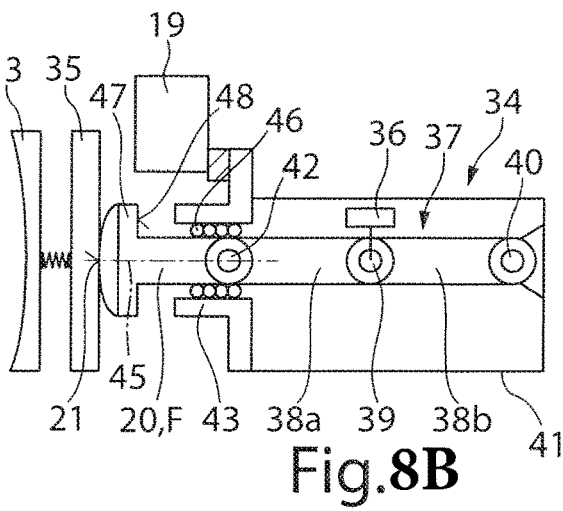
Fig. 8A    Fig. 8B

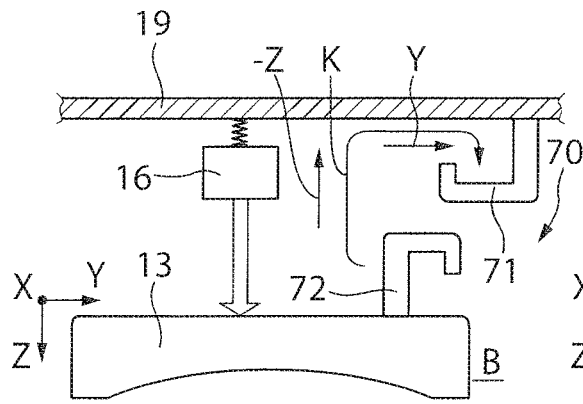 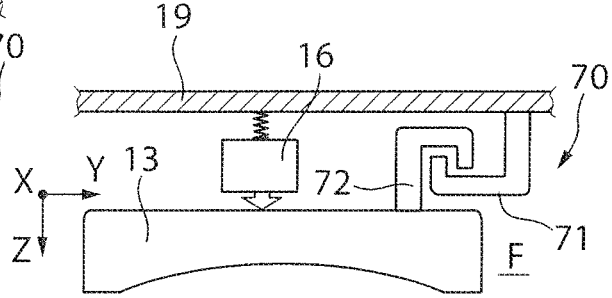
Fig. 12A　　　　　Fig. 12B
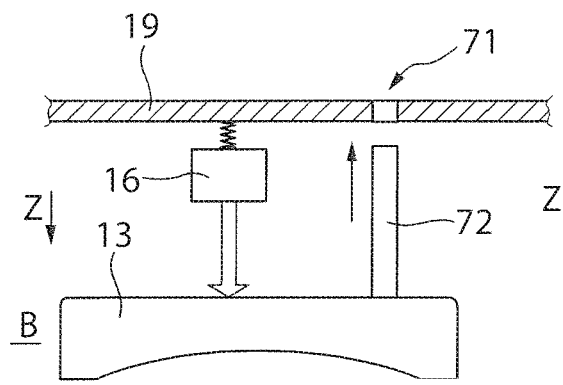 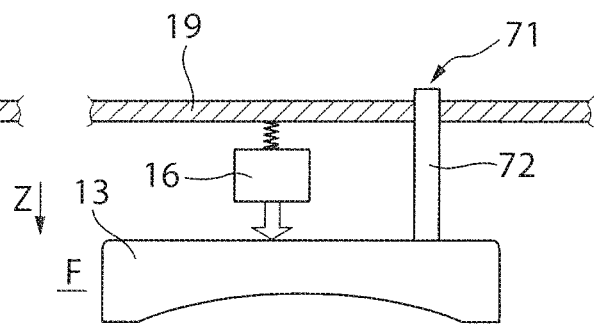
Fig. 13A　　　　　Fig. 13B
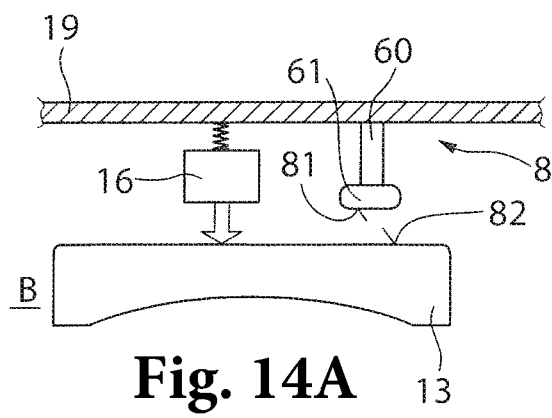 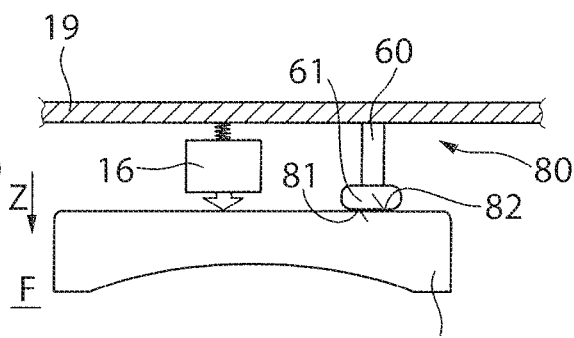
Fig. 14A　　　　　Fig. 14B

OPTICAL ARRANGEMENT, IN PARTICULAR LITHOGRAPHY SYSTEM, WITH A TRANSPORT LOCK

CROSS-REFERENCE TO RELATED APPLICATIONS

The present application is a continuation of, and claims benefit under 35 USC 120 to, international application PCT/EP2017/083836, filed Dec. 20, 2017, which claims benefit under 35 USC 119 of German Application No. 10 2017 200 636.6, filed Jan. 17, 2017. The entire disclosure of these applications are incorporated by reference herein.

FIELD

An aspect of the disclosure relates to a device, for example a lithography system, in particular an EUV lithography system, including: a first component, in particular a carrying frame, a second component, which is movable in relation to the first component, in particular a mirror, and also at least one stop with at least one stop face for limiting the movement of the second component in relation to the first component.

BACKGROUND

For the purposes of this application, a lithography system is understood as meaning an optical system or an optical arrangement that can be used in the field of lithography. Apart from a lithography apparatus, which serves for the production of semiconductor components, the optical system may be for example an inspection system for the inspection of a photomask (hereinafter also referred to as a reticle) used in a lithography apparatus, for the inspection of a semiconductor substrate to be structured (hereinafter also referred to as a wafer) or a metrology system, which is used for measuring a lithography apparatus or parts thereof, for example for measuring a projection system. The optical arrangement or the lithography system may be in particular an EUV lithography system, which is designed for used radiation at wavelengths in the EUV wavelength range of between about 5 nm and about 30 nm.

Reference is often made hereinafter two a movable (second) component or a moved/movable object in the form of a mirror, in particular an EUV mirror. In principle, however, the movable component may also be any other object or any other component or subassembly, for example optical elements such as lenses or prisms, wafer stages, parts of machine tools, further carrying frames or carrying structures for optical or non-optical components, etc.

The first component may be for example a carrying frame (known as a "force frame") of the optical arrangement, which substantially absorbs all of the forces acting on the optical arrangement. The movable component is typically spring-mounted with respect to the carrying frame, or mechanically decoupled from it, so that ideally no forces or vibrations are transmitted from the carrying frame to the movable component. The first component may, however, also be some other component, for example a carrier component, which is spring-mounted with respect to the carrying frame of the optical arrangement or mechanically decoupled from it.

In the case of an EUV lithography apparatus, specifically in the case of an EUV lens for projecting an image of a mask onto a light-sensitive substrate, the sensitivity of the quality of the imaging with respect to the deformation of optical surfaces of EUV mirrors is particularly great. On the assumption that the optical design of such a lens is corrected to about 10 mλ, where λ denotes the operating wavelength, it follows that at an operating wavelength λ of about 13.5 nm there is a maximum allowed wave-front error of about 135 pm. This means that a deformation of the surface of an EUV mirror of about 50 pm already results in a significant wavefront aberration. Therefore, during the operation of an EUV lithography apparatus or an EUV lens, EUV mirrors are set in an suspended state, so that the forces and moments acting on the EUV mirror become as small as possible. This state of being suspended or being mechanically decoupled from the surroundings has the consequence that the EUV mirrors can in effect move freely between their end positions, which are typically defined by end stops, and may collide with the end stops. Particularly when transporting an EUV lithography apparatus, but also in the event of an earthquake, this can lead to damages to the EUV mirrors or other components.

In the case of conventional EUV lenses, this issue is solved by inverting them during transport. In this case, the forces that bring about a weight compensation and lead to a suspended state of the EUV mirrors in the operating position of the EUV lens or of the EUV lithography apparatus, and also the forces of the weight of the mirrors, add together to form an overall force or overall acceleration, which corresponds approximately to twice the acceleration due to gravity (2 g). In this way, the mirrors generally stay fixed in their vertical end positions up to an acceleration of the order of 2 g. In the case of greater accelerations, the EUV mirrors may however leave the end positions and again lie freely between the end positions, i.e. the fixing of the EUV mirrors is limited with respect to the tolerable shock loads. In the case of future EUV lenses, the EUV mirrors may possibly become so large and heavy that inversion of the EUV lens is no longer advisable or possible.

DE 10 2012 212 503 A1 discloses a lithography apparatus which has a first component and a second component and also a coupling device in order to couple the first component and the second component to one another. The lithography apparatus has a sensing device for sensing a movement of a base on which the lithography apparatus stands, and also a control device, which is designed to activate the coupling device in dependence on the sensed movement of the base in order to limit a movement of the second component in relation to the first component. For this purpose, the coupling device may have at least one adjustable end stop. The adjustable end stop may be brought into abutting contact with a second component in the form of a mirror in order to achieve a form-fitting fixing of the mirror with respect to a first component in the form of a carrying frame. It is intended by the fixing to avoid damage to the mirror in the event of a shock or in the event of shaking as a result of an earthquake.

DE 10 2014 215 159 A1 describes an optical arrangement with at least one optical element and with a carrier, on which the optical element is arranged movably in relation to the carrier. A fixing device, with which the optical element can be fixed in place with respect to the carrier, has at least one actuator of a shape memory alloy. The fixing device is designed as a transport lock, which fixes the optical element in place with respect to the carrier when the optical element is not being used.

DE 10 2011 087 389 A1 describes a positioning system with a stop for a component, for example for an optical element, the stop limiting the path of movement of the component and being adjustably designed. The stop can be adjusted in such a way that the distance of the component from a stop face of the stop is kept in a predefined range.

SUMMARY

The disclosure seeks to provide an optical arrangement, in particular a lithography system, which is designed to reduce the damage to movable components during transport of the optical arrangement.

In a first aspect, the disclosure provide a device in which the optical arrangement, preferably the stop, has a fixing device for fixing the second component, which at least includes a fixing element that is movable in relation to the stop face of the stop.

The fixing of the second component, which is movable in relation to the first component, with the aid of the fixing device takes place in such a way that the second component practically cannot move (any more) in relation to the first component. The stop face or the stop may be rigidly connected to the first component; however, the stop or the stop face may possibly also be mounted on the second component or rigidly connected to it. For the movement of the second component in relation to the first component (assumed hereinafter to be fixed in place), the optical arrangement may have one or more actuators, which act on the second component in order to move it, for example in order to displace or turn or tilt it.

It is typically assumed hereinafter that the second component is movable in relation to the (fixed) first component, for example with the aid of actuators, so that the second component is also referred to as the movable component. However, this is not necessarily the case, i.e. the first component may possibly be movable with the aid of actuators instead of the second component. It is also possible for both components to be mounted movably in relation to a fixed system of coordinates, for example if the two components are two carrying structures, for example two carrying frames of the optical arrangement.

The fixing device or the fixing element is preferably a component part of the stop, i.e. the fixing element and the stop typically act on the movable second component substantially at the same location or in a (substantially) contiguous surface region. The combination of the (end) stop with the fixing device or the fixing element that fixes the movable component for transporting the optical arrangement offers many advantages: On the one hand, the accessibility of the optical arrangement is involved at far fewer locations than in the case of a solution in which the fixing device and the stop are arranged spatially separately; on the other hand, as a result the number of interfaces or surface regions on the movable component can also be minimized, limited or used for both functions.

During normal operation of the optical arrangement, the movable component is typically not in contact with the stop, i.e. is not in contact with the stop face or with the fixing element of the stop. During transport, the transport securing function can be ensured by the fixing device integrated in the (end) stop, to be more precise by the fixing element, which in the case of transport fixes the movable component, for example in the form of a mirror. This may involve the movable component being clamped against a fixed component, for example against the carrying frame, or possibly against other (end) stops, or possibly fixed in a form-fitting manner.

As an alternative to the combination of the fixing element or the fixing device with the stop, it is also possible to spatially separate the stop and the fixing element or the fixing device. In this case, the fixing device may for example have an actuator for moving the fixing element into a fixing position, in which the fixing element presses against the movable component in a first surface region, which is spatially separate from a second surface region, at which the stop face of the stop presses against the movable component, for example in the event of a shock. In this case, the fixing of the movable component may for example take place by the fixing device pressing the movable component against the (fixed) stops or against their stop faces in the fixing position and securely clamping them. By suitably choosing the direction of the force that the fixing element exerts on the movable component, a single fixing element may possibly be sufficient to fix or securely clamp the movable component as a whole.

A pressure cylinder, which can be moved by varying the pressure in a supply line to the pressure cylinder, may serve for example as an actuator for moving the fixing element. The movable pressure cylinder may act on a fixing element, for example in the manner of a fixing bolt, in order to fix the movable component. The movable component can be released again by the same mechanism, i.e. via the pressure cylinder. Instead of a pneumatic actuator, an electromechanical actuator, for example an electric motor or a relay (electromagnet) may also act on the fixing element, in order to move the fixing element from the fixing position into the operating position, and vice versa. A shape memory alloy may also be used to form a simple and low-cost "electric motor", which can serve as an actuator for a mechanical fixing element or possibly itself as a fixing element. For example, for this purpose an electric current may be conducted through a wire of a shape memory alloy, with the effect that the wire tries to resume its original shape.

The fixing element may act on the second, movable component with a direct or indirect force effect. In the case of the direct force effect, the feeding or fixing direction and the direction of the shock forces to be absorbed run parallel in the mechanism that is used for the fixing. In the case of an indirect force absorption, on the other hand, the shock forces to be absorbed are perpendicular to the feeding or fixing direction.

As an alternative to the configuration described above of the transport lock, with which the component is pressed or clamped in a predetermined position and a certain pressure is permanently exerted on the (fixed) component, also possible is a transport lock or a fixing with which there is only a strict limitation of the range of movement of the movable component, in order to minimize a movement of the movable component, with which however no forces are exerted on the movable component "at rest", i.e. in the fixed position. In this case, the fixing element possibly does not abut with a fixing face completely against the movable component in the fixing position, but instead is kept at a small distance from the movable component, for example of less than about 10 µm, in the fixing position. In this way, the possibility of movement of the movable component is restricted to a minimum by the fixing element in the fixing position, which is possibly sufficient to prevent damage to the second component during transport. In the operating position, the fixing element is typically kept at a further distance from the movable component than in the fixing position, in order not to restrict the possibility of movement of the second component unnecessarily.

In a development, the fixing element is movable, in particular manually, between a fixing position, in which the fixing element abuts (with a fixing face) against the second component, and an operating position, in which the fixing element is spaced apart at a (further) distance from the second component. For the purposes of this application, the abutting of the fixing element against the second component is understood as meaning contact, i.e. generally contact over a surface area, between the fixing element and the second component or the arrangement of the fixing element or its fixing face at a small distance of less than about 10 µm in front of the movable component (see above). In both cases, the moving of the fixing element into the fixing position allows the stop to be used as a transport lock. For this purpose, the fixing element is moved from the operating position into the fixing position. The movement of the fixing element from the operating position, in which the component can be moved in relation to the carrying frame, into the fixing position (and vice versa) may for example take place manually, for example in that the fixing element is moved or displaced possibly with the use of fixing screws or with the aid of a tool, for example with the aid of a rod or the like.

In a development, the optical arrangement or the stop has at least one actuator for moving the fixing element between the fixing position and the operating position. The actuator for moving the fixing element may be for example a piezo actuator, but other drive concepts, for example the use of electromotive drives, etc., are also possible.

In one embodiment, the stop has a rod-shaped portion with a head region, in which at least one stop face is formed, and the fixing element is guided displaceably in the longitudinal direction of the rod-shaped portion. The or a stop face of the stop may for example be mounted on the end face of the head region or run around the head region. The head region may have a damping device, for example in the form of one or more elastomer elements, which are formed in the head region on the typically metallic rod-shaped portion. The stop faces are in this case formed on the damping elastomer elements, in order to damp the impact of the movable component against the stop face in the event of sudden shock, for example in the event of an earthquake.

In a development, the fixing element, in particular at least its fixing face, surrounds the rod-shaped portion of the stop a ring-shaped manner, in particular in the form of a circular ring. In this way, a particularly compact stop with an integrated transport securing function can be realized.

In a further embodiment, the movable component has a recess, in which the stop engages with the head region, the periphery of the recess preferably having a bevel for the abutting contact of the fixing element, to be more precise a fixing face of the fixing element, in the fixing position of the fixing element. The recess may for example be formed as a cylindrical bore, into which the head region of the stop engages. A stop face of the head region, for example running around in the form of a (circular) ring, can in this case limit the movement of the component for example in the XY direction, while a further stop face, which is formed on the end face of the stop or of the head region, limits it movement for example in the Z direction, when the component strikes up against the stop face at the bottom of the recess or of the bore. The fixing face, typically running around in the form of a ring, may for example be formed as conically tapering and engage in the bevel formed on the periphery of the recess. In this way, the fixing device can limit the movement of the movable component in all three spatial directions, and fix it in all three spatial directions, in the fixing position.

In a development, the fixing element is designed for spreading open the head region of the stop against a lateral surface of the recess or of the bore. In this case, the head region, or possibly the entire stop, may consist of one or more components which are spread open with the aid of the fixing element, so that they abut against the lateral surface of the recess or are pressed against the lateral surface of the recess. The spreading open of the head region may also serve the purpose of setting the width of the gap between the stop and the lateral surface of the recess and may in this way be suitable for restricting the range of movement of the component.

In a development, the head region of the stop has at least two head portions that are movable in relation to one another, between which the fixing element engages in the fixing position. In this development, the stop is typically formed as two or more parts. During operation, the form of the stop corresponds substantially to the form of a conventional end stop. In the case of transport, in which the fixing element is in the fixing position, the head portions that are movable in relation to one another are pressed by the fixing element against the lateral surface of the recess and clamp the movable component. If there is sufficiently great friction between the head portions and the lateral surface of the movable component, the stop acts as a transport lock both in the XY direction and in the Z direction. Here, the two head portions may be respectively mounted on an own rod-shaped portion of the stop, the end of which that is remote from the head portion can be mounted on the carrying frame via a joint in order to make possible the spreading open by the fixing element.

It is likewise possible that two or more of the stops have at least one actuator to move or displace the stop face in relation to the movable component or the carrying frame, so that it presses against the movable component in a fixing position in order in this way to clamp the movable component between the stop faces of the stops, as is described for example in DE 10 2012 212 503 A1 cited at the beginning. In the case of two or more end stops the end faces of which do not lie directly opposite one another as in DE 10 2012 212 503 A1, it may possibly be advantageous to make possible not only a displacement in the longitudinal direction of the rod-shaped portion by the actuator but also a displacement transversely to its longitudinal direction, in order in this way to securely clamp the movable component between the stops or between the stop faces of the stops.

In a further embodiment, in the fixing position the fixing element presses the second component against at least one stop face of a stop. In this embodiment, the fixing element does not form part of the stop, i.e. it does not act on the movable component at a surface region or does not act in the vicinity of a surface region at which the stop, to be more precise the stop face, also acts on the movable component. By suitably choosing the direction in which the fixing element acts on the movable component, a single fixing element may possibly be sufficient to fix the entire component.

A further aspect of the disclosure relates to an optical arrangement of the type mentioned at the beginning, in particular as described further above, further including: an actuator with a drive for moving the stop between a fixing position, in which the stop face abuts against the second component, and an operating position, in which the stop face is kept at a distance from the second component, the actuator being designed to keep the stop in the fixing position (even) when the drive is switched off, i.e. deenergized. The drive may be for example a spindle drive, a direct linear drive, an electromotive drive, etc., or possibly a drive or motor that is not electrically operated.

The motorized or drive-operated actuator that acts on the stop can address the issue that the stop in the optical arrangement is generally only accessible with difficulty for manual actuation. The possibility of motorized actuation of the stop allows it also to be mounted at a position that is inaccessible but advantageous for the function as an end stop, and in particular is optimized with respect to the contact force and also with respect to the distance covered by the component in the event of a collision. It is merely involved for this purpose that a cable or the like for the connection of the adjusting electronics of the actuator is provided at an easily accessible position. The cable connection from the actuator may be routed to this easily accessible location, i.e. it is not absolutely necessary that there is an electrical connection between the actuator and the rest of the optical arrangement, even if such a connection is likewise possible. Suitable activation with the aid of a control signal allows the drive of the actuator, and consequently the stop, to be moved into the desired position, for example into the fixing position. The stop in the fixing position can be kept in the fixing position, and possibly in further positions (see below), in a deenergized state by the self-locking action of the actuator or of the drive.

The actuator is preferably designed also to keep the stop in the operating position, i.e. with the drive switched off, in a deenergized state, i.e. it is also possible in the operating position for the drive or the motor to be disconnected from the power supply without the stop leaving the operating position. In the operating position, the stop face of the stop is ideally at a predetermined distance from the movable component. With the aid of the actuator, the distance between the movable component and the stop face can be corrected or varied within certain limits during operation if so desired.

In the case of conventional stops, with which it is intended to secure two components in the form of carrying structures, for example a carrying frame ("force frame") and a sensor frame ("sensor frame"), during transport, for this purpose, before transport, a contact part is screwed in between the stop in the operating position and the movable component until it comes into contact with the stop face. After transport, the contact part is unscrewed again. In the case of inaccessible end stops, it must be hoped in this case that the width of the gap or the distance between the movable component and the stop face will be restored after transport. Checking the distance, for example with the aid of a caliper gauge, can only be carried out where the stops are accessible. If the gap between the stop and the movable component is too small, a mechanical short-circuit may occur, with the effect of disturbing the dynamic behaviour of the movable component or the optical arrangement and, in the worst case, resulting in the movable component, for example in the form of a mirror, no longer being able to move or be actuated.

In a development, the stop has a contact face, which abuts against the first component in the operating position, the contact face preferably being formed on a side of the stop that is opposite from the stop face. In the case of a stop in the operating position, up against the stop face of which the second, movable component comes, the force acting on the stop face is transmitted directly to the first component with the aid of the contact face, so that the drive does not have to absorb the force acting on the stop. The contact face may for example be formed on a peripheral flange or collar of the stop, on the opposite side of which the stop face is formed.

In a further embodiment, the actuator has a gear mechanism, preferably a lever mechanism, for the force transmission of the drive to the stop. The gear mechanism or the lever mechanism allows the force that is transmitted to the stop to be increased. With suitable design of the lever mechanism, it is also possible to produce a self-locking action of the actuator by the lever mechanism in the fixing position, as explained in more detail further below. Other gear mechanisms, for example parallelogram gear mechanisms, may also have a self-locking action.

In a development, the lever mechanism forms a toggle lever with two legs connected via a common joint, the stop preferably being connected to one of the two legs via a further joint. The toggle lever may for example be driven via a drive in the manner of a spindle drive or the like.

In the fixing position of the stop, the toggle lever is preferably in an extended position, a congruent position or an overextended position. If the toggle lever has gone beyond the dead centre or reached the dead centre, as is the case in the extended position (angle between the two legs or lever arms 180°), a congruent position (angle between the two legs or lever arms 0°), or in an overextended position of the toggle lever, an automatic locking effect is achieved when the toggle lever presses the stop against the second, movable component. Even if the actuating force of the drive drops in the fixing position, the clamping force of the toggle lever is maintained and it cannot loosen of its own accord. Therefore, the drive can typically be disconnected from the power supply as soon as the fixing position is reached. Moreover, in the extended or overextended position of the toggle lever, the forces acting on the drive are very small, even in the case where shocks occur during transport. Instead of the toggle lever described here, other motorized mechanisms that make self-locking or automatic locking possible may also be used, for example a spindle drive that is self-locking as a result of a suitably chosen pitch of the spindle.

In a further development, the stop is guided without twisting during the movement between the fixing position and the operating position. The stop is in this case kinematically guided in such a way that it is not turned about its longitudinal axis during the movement between the fixing position and the operating position, which is typically a linear movement. This is advantageous because particles which contaminate the surroundings of the stop can form during a turning movement of the stop, in particular when pressing the stop face against the movable component. Damages to the component can also be caused by the turning movement when placing the stop against the movable component. When using a toggle lever, the guidance without twisting can be achieved for example by the further joint, at which the stop is mounted on one of the two legs of the toggle lever, being designed as a hinge joint. Typically, the joint that connects the two legs of the toggle lever is also designed as a hinge joint, so that the stop can kinematically only be displaced in one plane, or in the case of the use of a linear guide, for example in the form of a bearing sleeve, only in one predetermined direction.

In a further embodiment, the optical arrangement additionally includes a shielding or encapsulation, which encapsulates at least the drive or the motor of the actuator with respect to the surroundings. The shielding can separate the drive of the actuator, in particular also the toggle lever, from the surroundings in a vacuum-tight manner, but it is possibly sufficient if the shielding or the encapsulation prevents or suppresses the escape of particles into the surroundings and is not completely vacuum-tight. A seal, which is intended to prevent the escape of particles into the surroundings of the shielding, may be provided for this purpose between a linear guide, for example a bearing sleeve, for guiding the stop and the stop itself. The seal may for example be designed as a rubbing seal or as a labyrinth seal.

A further aspect of the disclosure relates to an optical arrangement, in particular a lithography system, including: a first component, in particular a carrying frame, and a second component, which is movable in relation to the first component, in particular a mirror, a fluid, in particular a magnetorheological fluid, an electrorheological fluid or a thixotropic fluid, being introduced into an intermediate space between the first component and the second component.

In this aspect of the disclosure, a fluid which can bring about a damping of the movement of the second component and the viscosity of which can preferably be changed is introduced into the intermediate space between the first component and the second component. If it is an electrorheological fluid or a magnetorheological fluid, an adjustable damping of movement between the second, movable component and the first component can be produced (see below).

If the fluid is a thixotropic fluid, its viscosity changes in dependence on the load case, i.e. the thixotropic fluid has a greatly increased viscosity when there are great accelerations of the second component and behaves like a low-viscosity fluid when there are small accelerations of the second component. The selection of a suitable thixotropic fluid, for example in the form of a silicone-based modelling material, depends on the excitation spectra (vibration spectra) to be expected of the second component, for example during transport, in the event of a seismic shock and during operation. It should be expected here that the accelerations in the two first application cases are greater by a factor of about 10 than during the operation of the optical arrangement. The thixotropic fluid should be chosen such that, during transport and in the event of a seismic shock, the thixotropic material produces the best possible force fit between the two components, in order that the acceleration forces of the second, movable component that are produced can be absorbed by the first component. On the other hand, the thixotropic fluid should not inhibit the movement of the movable component, or only slightly, during the operation of the optical arrangement.

In a further embodiment, the optical arrangement has a container for keeping the fluid and also a feeding device for feeding the fluid from the container into the gap (and possibly vice versa, i.e. from the gap into the container). The fluid, for example in the form of the thixotropic fluid, is in this case only introduced into the gap when the optical arrangement is to be transported, or possibly if an imminent earthquake is detected. Shortly before operation, the fluid is removed again from the intermediate space or from the chamber volume provided for receiving the fluid, for example in that it is pumped back into the container or possibly removed from the optical arrangement in some other way. In this way, on the one hand the fluid can absorb the accelerations occurring during transport or in the event of a seismic shock and on the other hand it is ensured that there is no undesired transmission of forces or vibrations between the two components during the operation of the optical arrangement.

In order to avoid contaminations of the (vacuum) environment, the thixotropic material should be of very low volatility and/or be located in a volume that is closed off from the surrounding vacuum, for example by a membrane. One or more recesses for receiving the fluid may possibly be formed in the movable component, the recesses possibly being sealed off by a membrane.

In a development, the first component has at least one rod-shaped component, in particular a stop, with a head region which dips into the fluid. Via the rod-shaped component, the force can be transmitted from the fluid to the first component and be absorbed by the latter. The rod-shaped component may be an (end) stop, on which a stop face for the movable component is formed, but this is not necessarily the case, i.e. the component dipping into the fluid does not necessarily have to serve as a stop for limiting the range of movement or the predetermined adjusting range of the second component. In this case, the (thixotropic) fluid serves as a (shock) damping element and not as an locking device for the movable component. If the intermediate space between the first component and the second component is completely filled with the fluid, it may be possible to dispense with such a rod-like component.

In a further embodiment, the optical arrangement has at least one field-generating device for generating an electrical or magnetic field for changing the viscosity of the magnetorheological fluid or the electrorheological fluid. In this case, the fluid is typically also introduced into the intermediate space and can serve for damping the movement of the movable component during the operation of the optical arrangement. The viscosity of the fluid can be specifically changed by the device or by the choice of the field strength and also possibly the alignment of a respective electrical or magnetic field. With the aid of the field-generating device, the viscosity of the fluid can be made so great that it serves as a transport lock or as a damper for absorbing forces, for example in cases of shock loading. The field-generating device may for example be designed to generate for transport an electrical field that does not involve any energy for it to be maintained. For this purpose, for example charges may be transmitted to electrically conductive bodies, for example capacitor plates, between which the electrorheological fluid is introduced, so that they act in the manner of a capacitor.

A further aspect of the invention relates to an optical arrangement, in particular a lithography system, including: a first component, in particular a carrying frame, a second component, which is movable in relation to the first component, in particular a mirror, a housing, in particular a vacuum housing, with an interior space, in which the at least one movable second component is arranged, and also a fixing device for fixing the movable second component in relation to the first component, the fixing device having at least one fixing element, which in an operating position is kept at a distance from the movable component and in a fixing position abuts against the movable component, the fixing element being movable from the operating position into the fixing position, and vice versa, by changing the internal pressure in the housing.

In this aspect of the disclosure, use is made of the fact that the pressure in the interior space of the housing during the operation of the optical arrangement typically differs from the pressure in the interior space during the transport of the optical arrangement, in particular if the components arranged in the housing are operated under vacuum conditions, as is typically the case with EUV mirrors in EUV lithography systems, in particular in EUV lithography apparatuses. In this case, a small pressure, of for example no more than about $10^{-3}$ mbar, prevails in the vacuum housing during operation, while an overall pressure of about one bar, i.e. atmospheric pressure, generally prevails in the housing, for example a housing of a projection system, during transport. With the fixing device described here, the moving of the fixing element from the operating position into the fixing position may take place fully automatically by changing the pressure in the housing or the pressure surrounding the second component. Therefore, no feed lines—of any kind whatsoever—that involve complex pipework, leadthroughs, laying and/or activating measures, are used for the movement of the fixing element.

In a development, the fixing device is designed to move the fixing element from the operating position into the fixing position when there is an increase in the pressure in the interior space of the housing. Correspondingly, the fixing element is moved from the fixing position into the operating position when there is a decrease in the pressure in the interior space of the housing. As described further above, the mirrors in an optical arrangement in the form of an EUV lithography apparatus are operated under vacuum conditions, while the transport of the EUV lithography apparatus takes place at ambient pressure, so that it is reasonable that the fixing element is moved from the operating position into the fixing position when there is an increase in the pressure and is moved in the opposite direction, i.e. from the fixing position into the operating position, when there is a decrease in the pressure.

In a development, the fixing device has a gas volume which is sealed off from the interior space of the housing and may for example be formed in a further housing, and also a component which is movable in dependence on a difference between the internal pressure in the housing and a pressure in the gas volume and is coupled in terms of movement to the fixing element or forms the fixing element. The pressure in the sealed-off gas volume may for example be about 500 mbar, but also be greater or less. The size of the gas volume determines the spring constant or the sensitivity of the fixing device with respect to changes in the pressure difference. Typically, a great spring constant is advantageous, which can be achieved by a smallest possible gas volume that is sealed off from the surroundings. The sealed-off gas volume may for example form a chamber in a pneumatic piston, the piston rod of which forms the movable component and which has a further chamber, which is in connection with the interior space of the housing in which the second component is arranged. The coupling of the fixing element in terms of movement to the movable component is also understood as meaning a rigid coupling of the fixing element to the movable component.

If it is assumed for estimating the pneumatic forces that can be achieved for the movement of the fixing element that the pressure difference between the pressure in the interior space of the housing during transport and the pressure in the gas volume is about 0.5 bar, a weight of about 6 kg mass is obtained for a component, for example a mirror, with a diameter of about 4 cm. Although this force is generally not sufficient to hold the movable component as a whole, this force is certainly sufficient to move a comparatively light fixing element, such as for example a fixing bolt, for fixing the movable component, and in this way for spatially fixing the position of the movable component, for example via indirect force absorption.

In a development, the movable component is designed as a flexible membrane, which forms a wall region of a further housing in which the gas volume is located. The fixing element may be fastened on the flexible membrane, which in dependence on the pressure difference that acts on the two sides of the membrane opposite from one another bends correspondingly, and thereby moves the fixing element from the fixing position into the operating position, and vice versa. The distance that the fixing element covers between the fixing position and the operating position is typically comparatively small, so that it can be achieved by the changing of the curvature of the membrane. The membrane may for example be formed from a metallic material, because this is suitable for a vacuum, and therefore typically does not give off any particles into the surrounding vacuum in the interior space of the housing. The further housing is typically rigidly connected to the first, fixed component.

A further aspect of the disclosure relates to an optical arrangement, in particular a lithography system, including: a first component, in particular a carrying frame, a second component, which is movable in relation to the first component, in particular a mirror, at least one actuator for moving the second, movable component in relation to the first component, and also a fixing device for fixing the movable second component in relation to the first component, which has a first fixing element, mounted on the first component, and a second fixing element, mounted on the second component, the actuator being designed to move the movable second component into a fixing position, in which the first fixing element and the second fixing element interact in a form-fitting and/or force-fitting manner to keep the second component in the fixing position, typically in that they form a mechanical locking (lock and key principle).

In this aspect, it is proposed that at least one actuator, which is used to move the movable second component, for example a mirror, within a movement space that is used during operation ("operating range"), is also used for moving the movable component into a fixing position, which typically lies outside the movement space that is used during operation, but inside the movement space that is mechanically possible ("mechanical range") of the movable component. The mechanically possible movement space of the movable second component is typically limited by the end stops described further above.

The fixing position is not reached during normal operation of the optical arrangement and, in the case of a development, can only be moved to along a predetermined path curve of the movable second component and can only be left again by a predetermined (not necessarily identical) path curve. The path curve can generally be produced directly by the actuator or actuators that also serve(s) for the movement of the second component within the movement space that is used during operation, i.e. typically no additional actuators are used for this purpose. It is advantageous here that the actuators are typically designed to move the movable component in three translational and three rotational degrees of freedom, so that virtually any desired paths of movement can be produced with the aid of the actuators.

Lorentz actuators may be used for example for producing the path of movement, actuators in which such a great force is produced on the movable component by a briefly higher current through their coils that the movement space that is used during operation is left and the fixing position is reached. In the fixing position, the two fixing elements may for example engage in one another in the manner of a mechanical locking (lock and key principle).

In a development, the first fixing element and the second fixing element are designed in the form of hooks and the two hook-shaped fixing elements engage in one another in the fixing position. The hook-shaped fixing elements represent one possible way of realizing mechanical locking in the manner of a lock and key principle. It goes without saying that there are many other possible ways of making two fixing elements form a mechanical locking by a form fit, so that they cannot be released from the fixing position without a renewed movement of the second component.

In a development, the at least one actuator is designed to move the second fixing element in at least two different directions for leaving the fixing position (and typically also for moving the fixing element into the fixing position). In this way it can typically be prevented that the movable second component is unwantedly released from the fixing position, for example in the event of a shock, because the force acting on the second component is only exerted in one direction.

In an alternative embodiment, the first fixing element is designed to fix the second fixing element in the fixing position by applying a force along a fixing direction and to release the second fixing element from the fixing position by the renewed application of a force along the fixing direction. In this case, in a way similar to the mechanism of a ballpoint pen or a locking for an SD card slot, the first fixing element has a locking mechanism with a bistable state. The second fixing element, which may for example be designed in the manner of a suitably configured pin, is moved with a certain force in a linear movement along the fixing direction and forced into the mechanism, so that the second fixing element, for example in the form of the pin, is clasped in the fixing position and cannot be released counter to the fixing direction. After renewed application of a force to the second fixing element in the fixing direction (i.e. in the same direction), the clasping is released again. The corresponding mechanics may be formed for example via a cam disc or a cam gear mechanism in combination with a sawtooth shape for fixing the second fixing element. The forces for the movement of the second component or of the second fixing element may be applied as described further above by actuators, for example in the form of Lorentz actuators.

In a further configuration of the optical arrangement, it has a fixing device with at least one contact face for fixing the movable second component in relation to the first component, a surface region of the second component abutting against the contact face in a fixing position and fixing the second component on the contact face by adhesion.

The surface region of the second component and the contact face are typically very smooth surfaces, in the case of which the fixing takes place by adhesion or by what is known as wringing or optical contact bonding. If the second component is a mirror for EUV lithography, the surface region that comes into contact with the contact face is typically formed on a substrate material, which may for example be Zerodur® or ULE®, which if appropriately polished has a very low surface roughness. The contact face may be formed for example from a polymer material or an elastomer material, for example from an ethylene-propylene-diene rubber (EPDM), which likewise has a very smooth surface. The contact face may for example form a stop face of an end stop which limits the movement of the second component. In particular if the optical arrangement, for example in the form of an EUV lithography apparatus, is inverted for transport, the gravitational compensation has the effect that twice the weight (2 g) acts on the end stop or on the stop face that forms the contact face. The movable component is consequently pressed against the contact face with about 2 g, which with a suitably dimensioned size of the contact face is sufficient to fix or hold the entire component because of the forces of adhesion. The contact face does not necessarily have to be formed on a stop, but may also be formed on a component that is provided especially for this purpose in the optical arrangement.

Further features and advantages of the disclosure emerge from the following description of exemplary embodiments of the disclosure, with reference to the figures of the drawing, which show details of the disclosure, and from the claims. The individual features may be realized in each case individually by themselves or as a plurality in any desired combination in a variant of the device.

BRIEF DESCRIPTION OF THE DRAWINGS

Exemplary embodiments are represented in the schematic drawing and are explained in the following description. In the drawings:

FIGS. 2A-2B show schematic representations of a stop with a fixing device for fixing an EUV mirror which has a fixing element that is movable in relation to a stop face of the stop;

FIGS. 3A-3C show schematic representations of the stop from FIG. 2A,2B with three different configurations of an actuator for moving the fixing element;

FIGS. 4A-4B show schematic representations of a fixing element, which in a fixing position spreads open a head region of a multi-part stop and presses it against the lateral surface of a recess formed in the EUV mirror;

FIGS. 5A-5B show schematic representations of a fixing element, which in a fixing position presses the EUV mirror against the stop face of a stop or a number of stops for fixing;

FIGS. 6A-6B show schematic representations of an EUV mirror with actuable end stops, in order to clamp the EUV mirror between the stop faces of the end stops;

FIGS. 7A-7B show schematic representations of an EUV mirror in the case of direct and indirect force absorption by a fixing element, respectively;

FIGS. 8A-8B show schematic representations of a stop in an operating position and in a fixing position for fixing a sensor frame, the stop being kept in the fixing position via a toggle lever;

FIGS. 12A-12B show schematic representations of an EUV mirror which is movable via an actuator along a curved path of movement in order to move a hook-shaped fixing element of the EUV mirror into a fixing position, in which it engages in a further hook-shaped fixing element;

FIGS. 13A-13B show schematic representations of an EUV mirror with a fixing element, which can be moved via an actuator into a fixing position in a linear movement by applying a force along a fixing direction and can be released from the fixing position by the renewed application of a force along the fixing direction; and FIGS. 14A-14B show schematic representations of an EUV mirror with a polished surface region, which in a fixing position abuts against a contact face of a fixing device and is held on the contact face by forces of adhesion.

DESCRIPTION OF EXEMPLARY EMBODIMENTS

In the following description, identical reference signs are used for identical or functionally identical components.

Figure 1A:
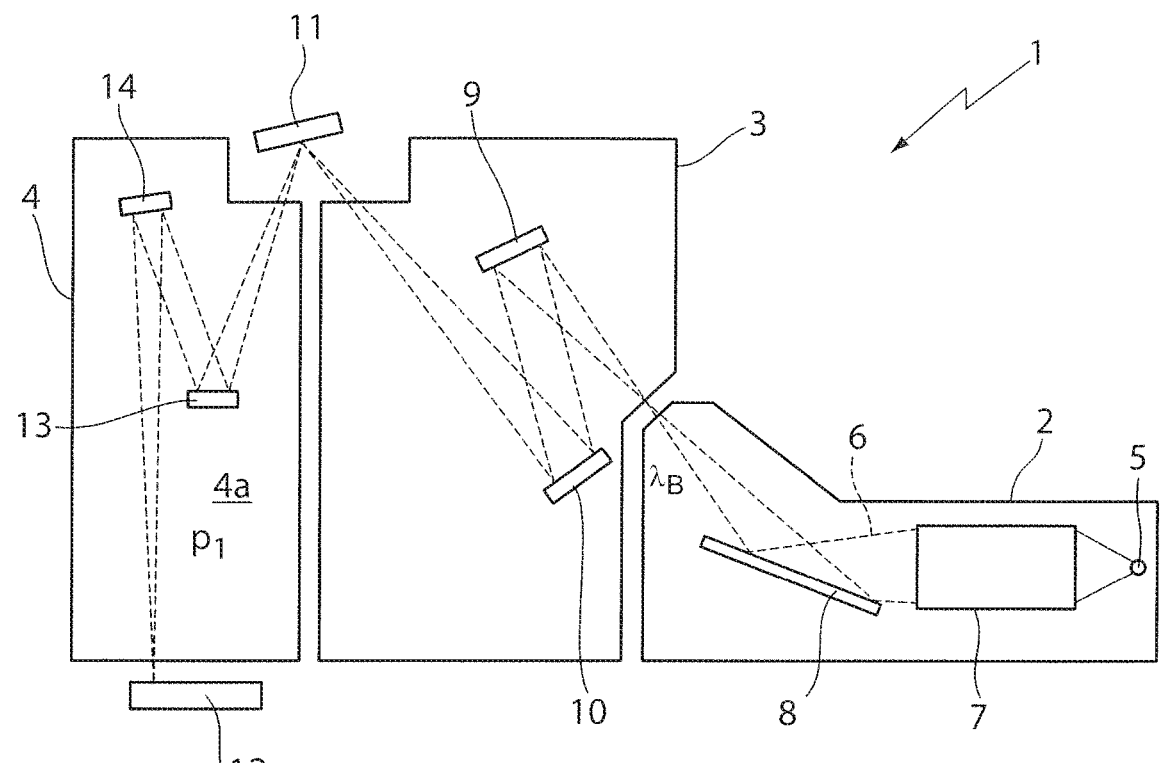
FIG. 1A shows a schematic representation of an EUV lithography apparatus with a plurality of movable components in the form of mirrors.

In FIG. 1A, an EUV lithography system in the form of an EUV lithography apparatus 1 is schematically shown. The EUV lithography apparatus 1 has a beam generating system 2, an illumination system 3 and a projection system 4, which are accommodated in separate vacuum housings and are arranged one following the other in a path of rays of EUV radiation 6 emerging from an EUV light source 5 of the beam shaping system 2. For simplification, the beam generating system 2, the illumination system 3 and the projection system 4 are understood hereinafter as also meaning the corresponding vacuum housings 2, 3 and 4. A plasma source or a synchrotron can serve for example as the EUV light source 5. The radiation emerging from the EUV light source 5 in the wavelength range between about 5 nm and about 20 nm is first focused in a collimator 7. With the aid of a downstream monochromator 8, the desired operating wavelength 4, which in the present example is about 13.5 nm, is filtered out. The collimator 7 and the monochromator 8 are formed as reflective optical elements.

The EUV radiation treated in the beam generating system 2 with regard to wavelength and spatial distribution is introduced into the illumination system 3, which has a first and a second reflective optical element 9, 10. The two reflective optical elements 9, 10 guide the EUV radiation 6 onto a photomask 11 as a further reflective optical element, which has a structure that is imaged via the projection system 4 on a reduced scale onto a light-sensitive substrate in the form of a wafer 12. For this purpose, a third and a fourth reflective optical element 13, 14 are provided in the projection system 4.

The reflective optical elements 9, 10, 11, 13, 14 respectively have an optical surface, which is exposed to the EUV radiation 6 of the light source 5. The optical elements 9, 10, 11, 13, 14 are operated in the EUV lithography apparatus 1 under vacuum conditions. In the projection system 4, to be more precise in the interior space 4a of the corresponding vacuum housing 4, there prevails for example a pressure $p_1$ of for example less than about $10^4$ mbar, i.e. a pressure that is much lower than atmospheric pressure.

Figure 1B:
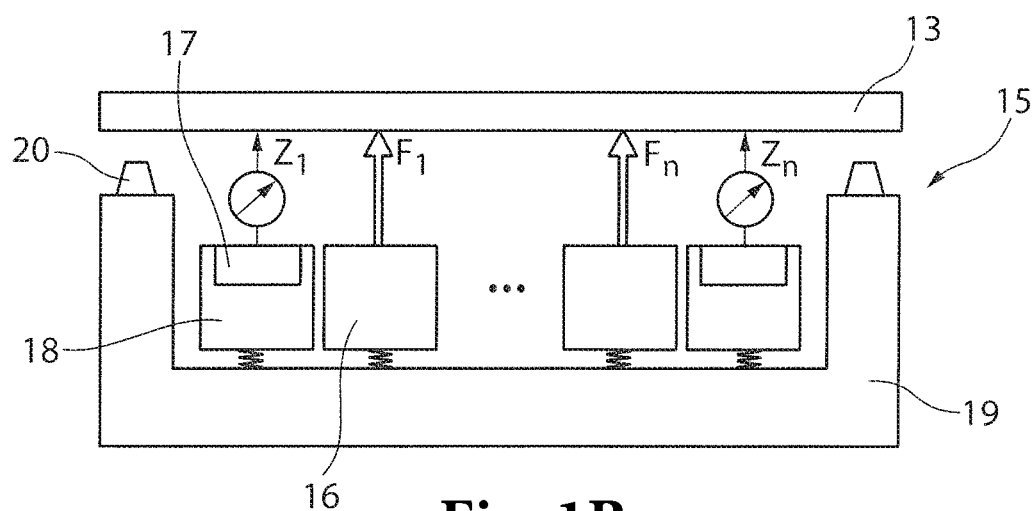
FIG. 1B shows a schematic representation of a mirror module with one of the EUV mirrors from FIG. 1A and also with two (end) stops for limiting its path of movement.

FIG. 1B shows by way of example a mirror module 15, which has a movable component in the form of the first EUV mirror 13 of the projection system 4 from FIG. 1A. The mirror module 15 has a number of mirror actuators 16, which serve for moving the EUV mirror 13 and respectively exert a force $F_1, \ldots F_n$ on the EUV mirror 13, in order to position or align and manipulate it in all six degrees of freedom, i.e. both in all three translational degrees of freedom ($T_X$, $T_Y$, $T_Z$) and in all three rotational degrees of freedom ($R_X$, $R_Y$, $R_Z$), in three-dimensional space. In addition, sensors 17 are provided for the detection of information $Z_1, \ldots Z_n$ concerning the position and orientation of the EUV mirror 13 in space. Both the actuators 16 and the sensors 17, to be more precise their sensor frame 18 ("sensor frame"), are/is mounted on a carrying structure or a carrying frame 19 ("force frame") in a mechanically decoupled (spring-mounted) manner. The carrying frame 19 absorbs substantially all of the forces acting on the mirror module 15. The carrying frame 19 may extend over the entire EUV lithography apparatus 1 in which the mirror module 15 is installed, but it may also be possible that the carrying frame 19 itself is fastened or spring-mounted on a further carrying structure. In the example shown in FIG. 1B, two end stops are mounted on the carrying frame 19, also referred to hereinafter as stops or as end stops 20.

The number of actuator and sensor axes depends on the number of degrees of freedom to be manipulated. If all six degrees of freedom are to be manipulated, at least six actuator and sensor axes are involved, with a corresponding arrangement. The actual arrangement of the actuators 16 or the setup of the mounting of the EUV mirror 13 substantially corresponds in this case to a hexapod.

As described further above, the EUV mirror 13 is mounted on the carrying frame 19 in a mechanically decoupled or sprung manner ("floating"). So-called weight compensators on the basis of permanent magnets may be used for example for the "floating" mounting of the EUV mirror 13 on the carrying frame 19, as described for example in US 2013/0314681 A1, which is incorporated into the content of this application by reference. Lorentz actuators may be used for example for the mirror 13 as actuators 16 which typically have an energizable coil and a permanent magnet kept at a distance from the latter, as described for example in DE 10 2011 004 607 A1, which is incorporated into the content of this application by reference.

The travelling distances or the movement space that is used during operation of the EUV mirror 13 are/is usually just a few to several 100 micrometres (μm) translationally or just a few millirads (mrad) rotationally. The end stops 20 serve the purpose of avoiding unwanted and critical collisions of the EUV mirror 13 and of limiting or defining the maximum possible mechanical movement space of the EUV mirror 13. Before the EUV mirror 13 bumps into anything in the EUV lithography apparatus 1, the movement of the EUV mirror 13 is absorbed with the aid of the end stops 20. Particularly when the EUV lithography apparatus 1 is being transported, the repeated, uncontrolled striking of the EUV mirror 13 or the EUV mirrors 9, 10, 13, 14 against the end stops 20 can cause damage, in particular in cases of great accelerations (>2 g).

It is therefore advantageous to fix the EUV mirror or mirrors 9, 10, 13, 14 and also possibly further movable components that are present in the EUV lithography apparatus 1, such as for example sensor frames, etc., before the EUV lithography apparatus 1 is transported, so that they are no longer freely movable between the end stops 20. There are many possible ways of providing such a transport lock, a number of which are described below.

FIGS. 2A-2B show an end stop 20, which has a rod-shaped portion 20a, which is rigidly fastened by one end on the carrying frame 19. Formed at the free end (head end 20b) of the rod-shaped portion 20a of the stop 20 is a first, slightly curved stop face 21a, which serves for absorbing shock forces in the direction of gravitational force (Z direction) when the EUV mirror is accelerated against the stop 20 in FIG. 2A in the (negative) Z direction. Also formed at the head end 20b of the stop 20 or of the rod-shaped portion 20a is a second stop face 21b, which runs peripherally around in the form of a ring and against which the EUV mirror 13 strikes when it is accelerated perpendicularly to the Z direction (in the X direction or in the Y direction). In order to avoid that the EUV mirror 13 is damaged when it strikes against the stop faces 21a,b, the latter are respectively formed on an elastomer element suitable for a vacuum, which surrounds the free end of the typically metallic rod-shaped portion 20a of the stop 20.

In the example shown in FIGS. 2A-2B, the free end or the head end of the end stop 20 protrudes into a recess 22 of the EUV mirror 13. During the operation of the EUV lithography apparatus 1, a gap is formed both between the first stop face 21a and the bottom of the recess 22 and between the peripheral second stop face 21b and the lateral surface of the annular recess 22, so that the EUV mirror 13 can be moved in relation to the carrying structure 19.

In the example shown, the end stop 20 has as a transport lock a fixing device 23 with a fixing element 24, which in FIG. 2A is shown in an operating position B, in which the fixing element 24 is kept at a distance from the EUV mirror 13. The fixing element 24 can be moved out of the operating position B into a fixing position F, which is shown in FIG. 2B and in which the fixing element 24, to be more precise a substantially conical, peripheral fixing face 25 of the fixing element, abuts against the EUV mirror 13, to be more precise against a peripheral, substantially conical bevel 26 of the recess 22. The abutting contact of the peripheral bevel 26 on the peripheral conical fixing face 25 of the fixing element 24 arranged in the fixing position F allows a form fit which fixes the EUV mirror 13 in all three spatial directions, i.e. both in the Z direction and in the X and Y directions, for transport.

In the example shown in FIGS. 2A-2B, the fixing element 24 is guided displaceably in the longitudinal direction of the rod-shaped portion 20a and has a number of rod-shaped elements extending in the longitudinal direction of the stop 20, which are rigidly fastened on an annular head region of the fixing element 24 on which the fixing face 25 is also formed. In the example shown, the rod-shaped elements run through bores in the carrying frame 19, which like the stop 20 extend in the Z direction and which are arranged in a regular arrangement radially offset in the circumferential direction in relation to a centre axis of the rod-shaped portion 20a of the stop 20.

There are a number of possible ways to bring about the movement of the fixing element 24 from the operating position B, shown in FIG. 2A, into the fixing position F, shown in FIG. 2B, in an automated manner, i.e. with the aid of an actuator 27, three of which are represented by way of example in FIGS. 3A-3C. In the case of all three stops 20 that are shown in FIGS. 3A-3C, the fixing element 24 has at its end that is opposite from the head portion with the fixing face 25 an annular plate 28, on which the actuator 27 acts. In the example shown in FIG. 3A, there abuts against the annular plate an end face of a piezo actuator 27, which is likewise designed in the form of a ring and the length of which in the longitudinal direction of the stop (i.e. In the Z direction) can be changed (in the example shown shortened) by applying an electrical voltage, in order to move the fixing element 24 out of the fixing position F, shown in FIG. 3A, into the operating position B.

In the example shown in FIG. 3B, inserted between the annular plate 28 and the carrying frame 19 is a spring 29, which presses the fixing element 23 against a radially inwardly extending flange portion 30 of a cylindrical component, which is mounted on the end of the carrying frame 19 that is remote from the head region 20b of the stop 20. For moving the fixing element 24 out of the operating position B, shown in FIG. 3B, an actuator 27 (not represented in FIG. 3B) on the side facing the flange portion 30 can be pressed against the annular plate 28, in order to displace it, and consequently the fixing element 24, into the fixing position F counter to the action of the spring force.

In the example shown in FIG. 3C, the annular plate 28 is fastened with the aid of a number of piezo actuators 27 on the side of the carrying frame 19 that is facing away from the head region 20b of the stop 20. The piezo actuators 27 respectively have a head region, which abuts against the annular plate 28 on the side facing away from the head portion 20b of the stop 20. As in the case of the example shown in FIG. 3A, by applying a voltage, the piezo actuators 27 can be changed in their length in the Z direction, i.e. in the longitudinal direction of the rod-shaped portion 20a of the stop 20, in order to move the fixing element 24 out of the operating position B, shown in FIG. 3C, into the fixing position F. As an alternative to the examples shown in FIGS. 3A-3C, piezo actuators in the manner of piezo stepping drives or so-called "inchworm" piezo drives, which are based on a crawler-like principle of advancement, may be used. A movement of the fixing element 24 from the operating position B into the fixing position F, and vice versa, may also take place manually, i.e. without the use of an actuator, for example by tightening or loosening fixing screws provided for this purpose.

FIGS. 4A-4B show an example of a two-part stop 20, the head region 20b of which has two head portions 31a,b and the rod-shaped portion 20a of which is formed by two rods 32a,b, which are fastened on the carrying frame 19 via a respective joint 33a,b. The stop 20 has a fixing device 23 with a fixing element 24, which is movable between the operating position B, shown in FIG. 4A, and the fixing position F, shown in FIG. 4B, to be more precise displaceable in the Z direction (direction of gravitational force). In the example shown, the fixing element 24 is designed as a fixing pin and in the fixing position F engages between the two head portions 31a,b of the head region 20b, whereby they are spread out, so that they or the head region 20b is pressed in the radial direction against the lateral surface 22a of the recess 22, whereby the EUV mirror 13 is securely clamped. As long as the friction between the stop faces 21a,b of the two head portions 31a,b and the lateral surface 22a of the recess 22 is sufficiently great, the spread-open stop 20 can bring about fixing of the EUV mirror 13 not only in the X direction and in the Y direction, but also in the Z direction, i.e. the EUV mirror 13 can be fixed in all three spatial directions. As an alternative to the stop 20 shown in FIGS. 4A-4B, with which spreading open of two head portions 31a,b takes place, a stop 20 formed as one part may be used, in the case of which a head region 20b which is designed for example in the form of a ring and is at least partially formed from an elastic material is spread open, in that, as in the case of the example shown in FIGS. 4A-4B, a fixing element 24 is inserted into the annular head region 20b. In this case, the rod-shaped portion 20a may for example have a centring bore, in which the fixing element 24 is guided during its displacement.

The examples shown in connection with FIGS. 2A-2B, FIGS. 3A-3C and FIGS. 4A-4B of an (end) stop 20, which has a fixing device 23 with a fixing element 24 that is movable, to be more precise displaceable, in relation to the stop face 21a,b, are advantageous because accessibility of the EUV lithography apparatus 1 is involved at a smaller number of locations than in the case of a solution in which the fixing device 23 is arranged spatially separate from the (end) stop 20. It may nevertheless be advisable to spatially separate the fixing device 23 and the stops 20, as described in more detail below on the basis of FIGS. 5A-5B.

FIG. 5A shows the fixing element 24 that is displaceable in the Z direction of a fixing device 23 in the fixing position F, in which the fixing element 24 abuts against the EUV mirror 13 and exerts a force on it, so that the EUV mirror 13 is pressed against a cylindrically peripheral stop face 21b of an end stop 20, i.e. into its end-stop position. FIG. 5B correspondingly shows the fixing of the EUV mirror 13 in the XY plane, i.e. perpendicular to the Z direction, in which the fixing element 24 in its fixing position F presses laterally against the EUV mirror 13, so that the latter is fixed between the fixing element 24 and three end stops 20. As in the case of the example shown in FIGS. 4A-4B, an actuator not described in any more detail in FIGS. 5A-5B may be used for the displacement of the fixing element 24.

FIG. 6A shows a further possible way of fixing an EUV mirror 13 for transport purposes, in which all three end stops 20 are moved with the aid of actuators 34 indicated by arrows along their longitudinal direction from the operating position B into the fixing position F shown in FIG. 6A, in which they abut against the EUV mirror 13, in order to clamp it between the end stops 20. In the example shown in FIG. 6B, only one of the three end stops 20 is displaceable with the aid of an actuator 34, in order to press the EUV mirror 13 against the two fixed end stops 20 and in this way fix them for transport.

FIGS. 7A-7B show the two basic possibilities in which a shock effect or a force F on an EUV mirror 13 can be absorbed by a fixing element 24, which is moved via an actuator along a feeding or fixing direction R into a fixing position: In the case of the direct force absorption shown in FIG. 7A, the fixing direction R and the direction of the force F run parallel, while in the case of the indirect force absorption shown in FIG. 7B, the direction of the force F and the fixing direction R are perpendicular to one another. It goes without saying that mixed forms of direct force absorption and indirect force absorption are also possible, as is the case for example with the example shown in FIGS. 6A-6B.

FIGS. 8A-8B show a stop 20, which can be moved with the aid of an actuator 34 between an operating position B, shown in FIG. 8A, in which the stop 20, to be more precise its curved stop face 21, is kept at a distance from a movable component in the form of a carrying frame 35, and a fixing position F, shown in FIG. 8B, in which the stop 20, to be more precise its stop face 21, abuts against the carrying frame 35, in order to fix the latter in relation to the sensor frame 19, for example for transport. As can likewise be seen in FIGS. 8A-8B, the carrying frame 35 serves for the mechanically decoupled or spring mounting of an EUV mirror 13. During the operation of the EUV lithography apparatus 1, the carrying frame 35 is kept at a predetermined distance (gap width) from the sensor frame 19.

The actuator 34, shown in FIGS. 8A-8B, for the movement of the stop 20 has a drive 36 in the form of a spindle drive, which acts on a lever mechanism in the form of a toggle lever 37, which serves for the transmission of the force from the spindle drive 36 to the stop 20. The toggle lever 37 has a first and a second leg 38a,b, which are connected to one another respectively at a first end via a common joint 39 and are mounted rotatably about the latter. The second end of the first leg 38a is connected via a further joint 40 to a shielding 41 (housing), which seals off the actuator 34, to be more precise the toggle lever 37 with the drive 36, from the surrounding vacuum, in which the EUV mirror 13 is arranged, in order to prevent contamination by particles occurring during the actuation of the actuator 34, for example because of frictional forces.

The second end of the first leg 38a of the toggle lever 37 is connected via a further joint 42 to the stop 20, on which the stop face 21 is formed. The stop 20 is displaceably guided in a bearing sleeve 43. The joint 39 and the further joints 40, 42 are in each case hinge joints, so that the stop 20 does not twist during the movement between the fixing position F and the operating position B, i.e. the stop 20 is guided without twisting with respect to its centre axis 45. Inserted between the bearing sleeve 43 and the stop 20 is a sealing element 46, which serves the purpose of preventing the escape of particles through the intermediate space between the bearing sleeve 43 and the stop 20. The sealing element 46 also serves for mounting the stop 20 in the bearing sleeve 43, and may for example be designed as a rubbing seal.

In the case of the fixing position F shown in FIG. 8B, the toggle lever 37 of the actuator 34 is fully straightened, and therefore makes it possible to keep the stop 20 in the fixing position F even when the drive 36 is switched off. It goes without saying that, for this purpose, the toggle lever 37 can also be moved into an overextended position, in which the dead centre has likewise already been overcome. The fully straightened position (extended position) of the toggle lever 37 shown in FIG. 8B makes it possible that forces that act on the stop 20 in the event of shock loading are transmitted via the toggle lever 37 to the shielding 41, which is rigidly connected to the carrying frame 19, and are absorbed by the carrying frame 19, without great forces acting here on the spindle of the drive 36. In FIG. 8A, the angle that the two legs 38a,b form with one another in the operating position B is shown exaggerated. Generally, the distance that the joint 39 covers between the fixing position F and the operating position B is in the range of micrometres, so that the angle between the two legs 38a,b even in the operating position B is only slightly less than 180°. As an alternative to the fixing position F shown in FIG. 8B, in which the toggle lever 37 is in the extended position (angle of 180° between the two legs 38a,b or slightly overextended), the fixing position F of the toggle lever 37 may also be assumed in the congruent position (not shown) (angle of 0° between the two legs 38a,b or slightly overextended).

In order to move the stop 20 into the fixing position F shown in FIG. 8B before transport, the drive 36 only has to be briefly connected to the power supply and, because of the self-locking property of the stop 20, can be disconnected from the power supply directly after reaching the fixing position F. Also during the movement in the opposite direction, i.e. when the stop 20 is moved into the operating position B, the drive 36 can be switched off directly after reaching the operating position B. Apart from the fixing action by the (over)extension of the toggle lever 37, self-locking can also be achieved by a suitable choice of the thread pitch of the thread of the spindle of the drive 36, i.e. the spindle cannot turn when a force is acting on the stop face 21, so that the toggle lever 37 remains in the operating position B. The drive 36 only has to be activated to move the stop 20 between the two positions (B, F), but not to keep it in the respective position B, F. A control cable (not shown) may be used for the activation of the drive 36.

Also in the case of the operating position B shown in FIG. 8A, shock forces that act on the stop 20 may occur, for example in the event of an earthquake. In order to introduce these forces into the carrying frame 19, the stop 20 has a collar or a flange 47 with a contact face 48, which is formed at the head end of the stop 20, on a side facing away from the stop face 21. In the case of the operating position B of the stop 20 that is shown in FIG. 8A, the contact face 48 abuts against the end face of the bearing sleeve 43, which absorbs the force of the shock and transmits it to the carrying frame 19 rigidly connected to it.

Figure 9:
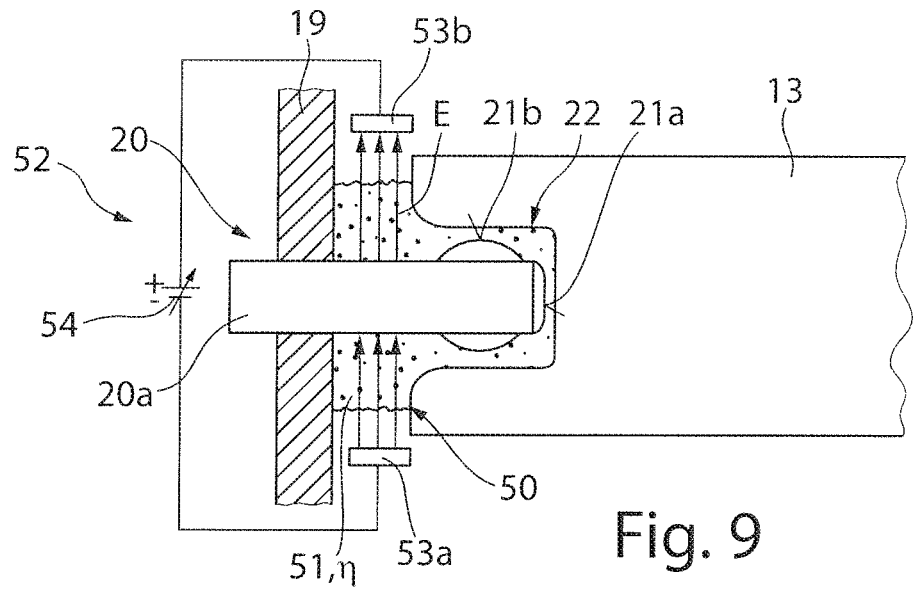
FIG. 9 shows a schematic representation of an EUV mirror in which an electrorheological fluid is introduced into an intermediate space between a carrying frame and the EUV mirror.

FIG. 9 shows a detail of an EUV mirror 13 and of a carrying frame 19, on which a stop 20 is mounted. In the example shown, the stop 20 protrudes with the head region 20b of the rod-shaped portion 20a into a recess 22 on the EUV mirror 13. An intermediate space 50, into which a fluid 51 is introduced, is formed between the EUV mirror 13 and the carrying frame 19, the intermediate space 50 also extending into the recess 22. The fluid 51 introduced into the intermediate space 50 allows damping of the movement of the EUV mirror 13 during the operation of the EUV lithography apparatus 1.

In the example shown in FIG. 9, the fluid 51 is an electrorheological fluid, for example polyurethane particles dispersed in silicone oil, the viscoelasticity or viscosity η of which changes when an electrical field E is applied, in the example shown generated by a field-generating device 52. The field-generating device 52 has for this purpose two capacitor plates 53a,b and also a controllable voltage source 54 for generating a voltage between the capacitor plates 53a,b. The field-generating device 52 allows the generation of a substantially homogeneous electrical field E in the electrorheological fluid 51, the field strength of which can be changed by an adjustable value for the voltage between the capacitor plates 53a,b, whereby the viscosity η of the electrorheological fluid 51 also changes. Changing the viscosity η allows the damping of the movement of the EUV mirror 13 to be changed in a targeted manner, for example in that the viscosity η is increased in order to rapidly decelerate the EUV mirror 13, or the viscosity η is reduced if a rapid movement of the EUV mirror 13 is desired for the correction of aberrations. For this purpose, the field-generating device 52 may for example be activated by a control device (not graphically represented) of the EUV lithography apparatus 1, which also allows the movement of the EUV mirrors 9, 10, 13, 14 with the aid of the actuators 16 shown in FIG. 1B.

It goes without saying that a magnetorheological fluid may also be introduced into the intermediate space 50 instead of an electroheological fluid 51 in order to produce an adjustable damping of the movement of the EUV mirror 13. In this case, a field-generating device, for example using an energizable coil, may be used for generating a magnetic field with an adjustable field strength in order to change the viscosity η of the magnetorheological fluid. The magnetorheological fluid may be for example a suspension with carbonyl iron powder.

The adjustment of the viscosity η of the electrorheological fluid 51 (and correspondingly of a magnetorheological fluid) may also be used in particular for choosing the viscosity η to be so great that the EUV mirror 13 practically can no longer be moved, i.e. the fluid 51 may serve for the fixing of the EUV mirror 13. This is advantageous in particular for realizing a transport lock with which the position of the EUV mirror 13 is to be kept constant in relation to the carrying frame 19, in order to prevent possibly multiple striking of the EUV mirror 13 against the stop faces 21a,b of the stop 20. In this way, the electrorheological fluid can be used together with the field-generating device 52 as a fixing device for fixing the EUV mirror 13 in relation to the carrying structure 19. Unlike the situation shown in FIG. 9, it is not absolutely necessary that the electrorheological fluid 51 is introduced into the intermediate space 50 in a region in which there is a stop 20.

Figure 10:
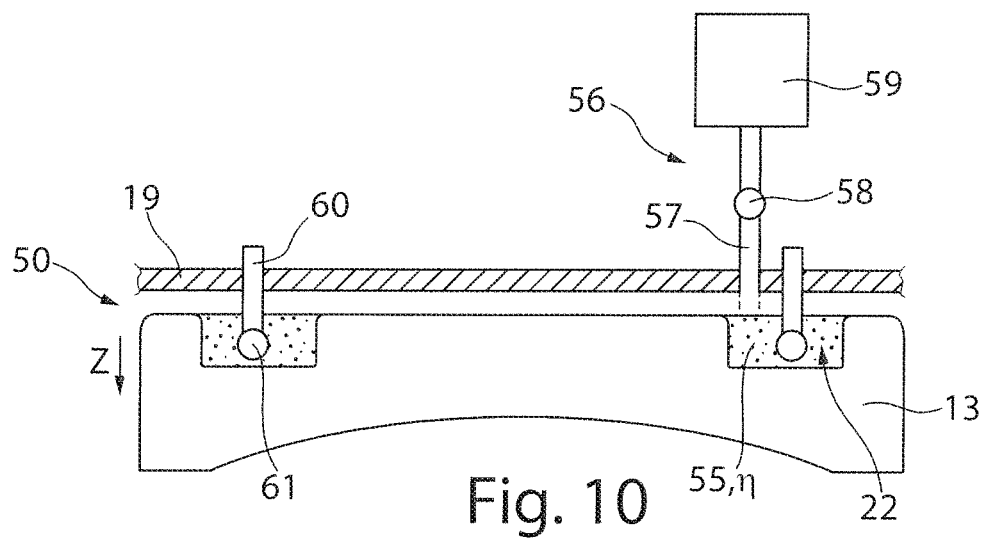
FIG. 10 shows a schematic representation of an EUV mirror in which a thixotropic fluid has been introduced into an intermediate space between a carrying frame and the EUV mirror.

FIG. 10 shows an example of an EUV mirror 13 in which a fluid, in the example shown a thixotropic fluid 55, is likewise introduced into an intermediate space 50 between the carrying frame 19 and the EUV mirror 13. The thixotropic fluid 55 has a viscosity η that varies depending on the load case, i.e. depending on the shearing forces acting on the thixotropic fluid 55. When there is a great acceleration of the EUV mirror 13, the thixotropic fluid 55 has a greatly increased viscosity, while it behaves like a low-viscosity fluid when there are small accelerations. The thixotropic fluid 55 may be composed of a number of different fluid constituents, for example of a boron- and silicone-based modelling material. The thixotropic fluid 55 or its damping spectrum may be adapted here in particular to the excitation or vibration spectrum to be expected of the EUV mirror 13 during transport, in the event of a seismic shock or during the operation of the EUV lithography apparatus 1.

In the case of the first two application cases (transport and seismic shock), the accelerations to be expected are typically greater by a factor of ten than during the operation of the EUV lithography apparatus 1. In the case of the first two application cases, the thixotropic fluid 55 should therefore bring about the best possible force fit between the EUV mirror 13 and the carrying frame 19, in order that the acceleration forces that are produced can be absorbed by the carrying frame 19. During operation, the thixotropic fluid 55 should inhibit as little as possible the movement of the EUV mirror 13. In addition or as an alternative to a thixotropic fluid 55, a rheopectic fluid may possibly also be used, in the case of which the viscosity η decreases with increasing shearing forces, which may possibly be advantageous during the operation of the EUV lithography apparatus 1.

In order to avoid that vibrations are transmitted from the carrying frame 19 to the EUV mirror 13 via the thixotropic fluid 55 during the operation of the EUV lithographic apparatus 1, the thixotropic fluid 55 may only be introduced into the intermediate space 50 shortly before the transport of the EUV lithography apparatus 1, to be precise via a feeding and discharging device 56, which has a feeding and discharging line 57 and also a pump 58, the latter pumping the thixotropic fluid 55 out of a storage container 59 into the intermediate space 50, to be more precise into the recess 22. After transport, the thixotropic fluid 55 may be removed from the intermediate space 50 or from the recess with the aid of the pump 58, but it may also be possible to remove the thixotropic fluid 55 from the intermediate space 50 in some other way, for example in that an enclosure, for example in the manner of a membrane, that otherwise closes off the intermediate space 50 from the surrounding vacuum in a substantially gas-tight manner, is opened. It may be possible to dispense with such a gas-tight enclosure or shielding if the thixotropic fluid 55 is only of very low volatility and, as in the case of the example shown in FIG. 10, the intermediate space 50 has a recess 22 in the EUV mirror 13 that is only open in the upward direction and into which the thixotropic fluid 55 is introduced.

In the case of the example shown in FIG. 10, the recesses 22 into which the thixotropic fluid 55 has been introduced may possibly be closed by a membrane (not shown), so that the thixotropic fluid 55 in any event cannot escape from the respective recess 22. To transmit rapid movements of the EUV mirror 13 to the carrying frame 19, in the case of the example shown in FIG. 10 two rod-shaped components 60 (rams) are provided, these components dipping with their respective head region 61 into the thixotropic fluid 55 within the respective recess 22 in order to transmit the force from the ram 60 dipped into the thixotropic fluid 55 to the carrying frame 19.

The rod-shaped components 60 shown in FIG. 10 do not serve as end stops, i.e. they are so far away from the EUV mirror 13 that the latter does not reach the rod-shaped components 60 during its movement. As in the case of the examples described further above, a number of end stops serve for limiting the movement of the EUV mirror 13, but are not shown in FIG. 10 for the sake of simplicity.

Figures 11A, 11B:
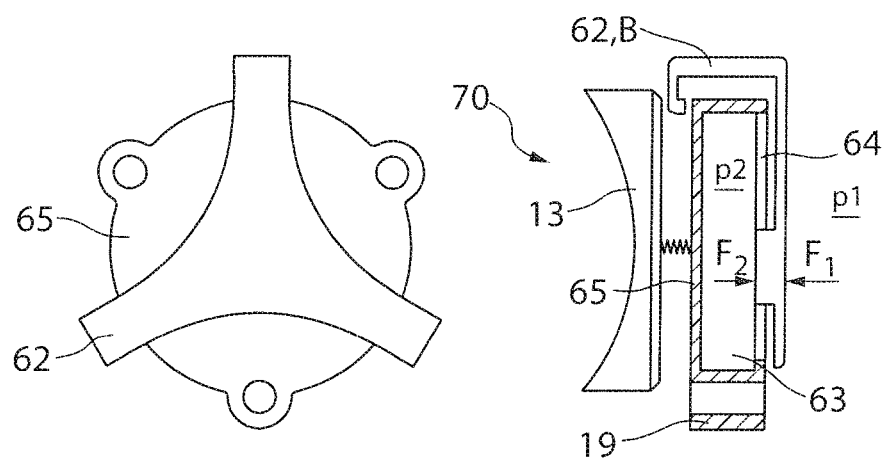
FIGS. 11A-11B show schematic representations of an EUV mirror in which a fixing element can be moved from an operating position into a fixing position, and vice versa, in dependence on an ambient pressure of the EUV mirror.

FIGS. 11A-11B show a fixing device 70 for fixing an EUV mirror 13, which has a fixing element 62, which is movable between an operating position B, shown in FIG.

11B, and a fixing position F (not graphically represented in FIGS. 11A-11B), in which the fixing element 62 abuts against the EUV mirror 13 and presses it against the end stops not shown in FIGS. 11A-11B, or possibly against other components, and thereby fixes it. In the example shown, the fixing element 62 can be moved from the operating position B into the fixing position F, and vice versa, by changing the internal pressure $p_1$ in an interior space 4a of the vacuum housing 4 (cf. FIG. 1A) of the projection system, in which the EUV mirror 13 is arranged. For this purpose, the fixing device 70 has a gas volume 63, which is sealed off from the interior space 4a of the (vacuum) housing 4 and is formed in a further housing 65, which has a wall region including a (metal) membrane 64. The membrane 64 is elastically deformable in dependence on a difference $p_1$-$p_2$ between the internal pressure $p_1$ in the housing 4 and a pressure $p_2$ in the gas volume 63 in the further housing 65, and bends in order to move the fixing element 62, which in the example shown is securely connected to the membrane 64, from the operating position B, shown in FIG. 11B, to the left into the fixing position F (not shown). The further housing 65 is securely connected to the carrying frame 19 via three fastening screws, indicated in FIG. 11A, and the EUV mirror 13 is movably mounted on the further housing 65. As described further above, the change in pressure brings about a relative movement of the fixing element 62 in relation to the further housing 65 to the left into the fixing position F, in which the fixing element 62 abuts against the rear side of the EUV mirror 13, in order to fix it for transport.

The movement of the fixing element 62 shown in FIGS. 11A-11B into the fixing position F takes place when the force $F_1$ that the internal pressure $p_1$ in the housing 4 exerts on the outer side of the membrane 64 is greater than the force $F_2$ that is exerted by the pressure $p_2$ in the gas volume 63 on the inner side of the membrane 64. In the example shown, a permanent static pressure $p_2$ of about 500 mbar prevails in the gas volume 63 in the further housing 65. In the example shown, the internal pressure $p_1$ in the interior space 4a of the housing 4 during the operation of the EUV lithography apparatus 1 is about $10^{-1}$ mbar, and is consequently much less than the pressure $p_2$ in the gas volume 63, so that the fixing element 62 is in the operating position B during the operation of the EUV lithography apparatus 1. If the EUV lithography apparatus 1 is being transported, typically an internal pressure $p_1$ that substantially coincides with the ambient pressure (about 1 bar) prevails in it, and consequently also in the housing 4. The fixing device 70 shown in FIGS. 11A-11B therefore makes it possible to provide a transport lock that moves back and forth between the fixing position F and the operating position B fully automatically, i.e. just on the basis of the changing ambient pressure of the EUV lithography apparatus 1, and consequently the changing internal pressure $p_1$ in the housing 4 in which the EUV mirror 13 is arranged.

FIGS. 12A-12B show an EUV mirror 13 with a fixing device 70 for fixing it on a carrying frame 19. The fixing device 70 has a first, hook-shaped fixing element 71, which is rigidly fastened on the carrying frame 19. A second hook-shaped fixing element 72 of the fixing device 70 is rigidly fastened on the EUV mirror 13. An actuator 16 is provided for moving the EUV mirror 13 during the operation of the EUV lithography apparatus 1. The actuator 16 serves the purpose of moving the EUV mirror 13 within a predetermined range of movement in order to correct aberrations. The EUV mirror 13 is moved with the aid of the actuator 16 into a fixing position F, shown in FIG. 11B, in which the two hook-shaped fixing elements 71, 72 engage in one another, i.e. the two fixing elements 71, 72 form a mechanical locking (lock and key principle).

In the example shown in FIGS. 12A-12B, the fixing position F can only be reached if the EUV mirror 13 is moved along a predetermined path curve K shown in FIG. 12A. For this purpose, via the actuator 16, which in the example shown is designed as a Lorentz actuator, it is possible by briefly applying a higher current or a current pulse for such a great force to be briefly exerted on the EUV mirror 13 that it leaves the actual range of movement and is accelerated in the negative Z direction (i.e. upwards). At a suitable point in time, the EUV mirror 13 is accelerated by a further current pulse in the Y direction (i.e. to the right), until the second hook-shaped fixing element 72 is arranged partially above the first hook-shaped fixing element 71 and comes into engagement with it because of the effect of gravitational force.

The EUV mirror 13 can only be released from the fixing position F, shown in FIG. 12B, if it passes through the path curve K in the opposite direction, it first being accelerated by a short distance upwards, i.e. in the negative Z direction, by a current pulse on the actuator 16 to overcome gravitational force, before it is accelerated to the left, i.e. in the negative Y direction, and subsequently lowered into the operating position B, shown in FIG. 12A, by the effect of gravitational force.

FIGS. 13A-13B show a fixing device 70, which, as in the case of the example shown in FIGS. 12A-12B, has a first fixing element 71, mounted on the carrying frame 19, and a second fixing element 72, mounted on the EUV mirror 13, in the manner of a pin. The pin-shaped second fixing element 72 is moved with the aid of the actuator 16 in a fixing direction (here: negative Z direction) into the fixing position F, shown in FIG. 13B, in that it is pressed into the first fixing element 71 by applying a force F. In the fixing position F, the second fixing element 72 is clasped by the first fixing element 71. After renewed application of a force F to the second fixing element 72 in the same direction (negative Z direction), the second fixing element 72 is released from the fixing position F and moved into the operating position B shown in FIG. 13A. The renewed application of force to the second fixing element 72 likewise takes place with the aid of the Lorentz actuator 16. For this purpose, in a way similar to the mechanism of a ballpoint pen or a locking for an SD card slot, the first fixing element 71 has a locking mechanism with a bistable state. The corresponding mechanics may be formed for example via a cam disc or a cam gear mechanism for producing a non-uniform movement in combination with a sawtooth shape for the fixing.

FIGS. 14A-14B show a further example of a fixing device 80 for fixing an EUV mirror 13, which has a contact face 81 for fixing the EUV mirror 13 on the carrying frame 19. In the example shown, the contact face 81 is formed on a rod-shaped component 60, which has a head region 61 of an elastomer material, for example of an ethylene-propylene-diene rubber (EPDM) with a very low surface roughness. The optical element 13 has on its rear side, to be more precise on the rear side of its mirror substrate, which may be for example a titanium-doped quartz glass such as ULE® or a glass ceramic, for example Zerodur®, a polished surface region 82, which likewise has a low roughness.

In the operating position B shown in FIG. 14A, the contact face 81 is kept at a distance from the EUV mirror 13, while in the example shown in FIG. 14B the EUV mirror 13, to be more precise the polished surface region 82, abuts against the contact face 81. If the EUV mirror 13 is pressed with sufficient force against the contact face 81, the adhesion between the contact face 81 and the EUV mirror 13 is maintained even after the pressing force is no longer applied, i.e. the EUV mirror 13 is fixed on the contact face 81 by adhesion. The pressing of the EUV mirror 13 against the contact face 81 may take place with the aid of an actuator 16, which moves the EUV mirror 13 in the negative Z direction and presses it against the contact face 81. The pressing may possibly also take place when the EUV lithography apparatus 1 is inverted for transport, in this case the gravitational compensation having the effect that the EUV mirror 13 is pressed against the contact face 81 with approximately twice gravitational acceleration 2 g.

The rod-shaped component 60 with the head region 61 may be one of the end stops 20 described further above, in the case of which the elastomer material on which the stop face 21a,b is formed is suitably chosen. However, the rod-shaped component 60 does not necessarily have to be an end stop that limits the range of movement of the EUV mirror 13; rather, the rod-shaped component 60 with the contact face 81 may be a transport lock that is spatially separate from the end stops 20.

Most of the examples described further above have been described on the basis of a movable component in the form of an EUV mirror 13, but it goes without saying that the movable component may also be almost any other desired component, for example a sensor frame, a mounting for an optical or non-optical element, etc. Also, the component that is assumed to be fixed in the above examples does not necessarily have to be the carrying frame 19; rather, it may possibly be a further component that is movable in relation to the base or in relation to a fixed reference system. It likewise goes without saying that the examples described further above have only been described in conjunction with an EUV lithography apparatus 1 by way of example and can also be used in the case of other optical arrangements.

What is claimed is:

1. An optical arrangement, comprising:
   a first component;
   a second component movable relative to the first component;
   a stop having a stop face configured to limit movement of the second component relative to the first component; and
   a fixing device configured to fix the second component, wherein:
      the fixing device comprises a fixing element movable relative to the stop face;
      the fixing element does not form part of the stop;
      the fixing element is movable between a fixing position and an operating position;
      in the fixing position, the fixing element abuts against the second component and the fixing element presses the second component against the stop face;
      in the operating position, the fixing element is spaced apart from the second component; and
      the optical arrangement is configured to be used in an EUV lithography system.

2. The optical arrangement of claim 1, wherein the first component comprises a carrying frame, and the second component comprises a mirror.

3. The optical arrangement of claim 1, further comprising an actuator configured to move the fixing element between the fixing position and the operating position.

4. The optical arrangement of claim 1, wherein:
   the stop has a rod-shaped portion with a head region which includes the stop face; and
   the fixing element is guidedly displaceable in a longitudinal direction of the rod-shaped portion.

5. The optical arrangement of claim 4, wherein the fixing element surrounds the rod-shaped portion in a ring-shaped manner.

6. The optical arrangement of claim 4, wherein the second component has a recess in which the stop engages with the head region.

7. The optical arrangement of claim 6, wherein the fixing element is configured to spread open the head region against the lateral surface of the recess.

8. The optical arrangement of claim 7, wherein:
   the head region comprises two head portions movable relative to each other; and
   the fixing element engages in the fixing position between the two head portions.

9. A system, comprising:
   an optical arrangement according to claim 1; and
   an actuator comprising a drive configured to move the stop between the fixing position and the operating position,
   wherein:
      the actuator is configured to keep the stop in the fixing position when the drive is off; and
      the system is an EUV lithography system.

10. The system of claim 9, wherein the stop has a contact face that abuts against the first component in the operating position, and the contact face is on a side of the stop that is opposite from the stop face.

11. The system of claim 9, wherein the actuator comprises a gear mechanism configured transmit force from the drive to the stop.

12. The system of claim 11, wherein the gear mechanism comprises a lever mechanism which comprises a toggle lever comprising two legs connected by a common joint.

13. The system of claim 12, wherein, in the fixing position, the toggle lever is in a position selected from the group consisting of an extended position, a congruent position, and an overextended position.

14. The system of claim 9, wherein the stop is guidable without twisting during movement between the fixing position and the operating position.

15. The system of claim 9, further comprising a shielding encapsulating the drive from its the surroundings.

16. A system, comprising:
   a carrying frame;
   a mirror movable relative to the carrying frame;
   a vacuum housing having an interior space in which the mirror is disposed;
   a fixing device configured to fix the mirror relative to the carrying frame,
   wherein:
      the fixing device comprises a fixing element having an operating position and a fixing position;
      in its operating position, the fixing device is spaced apart from the mirror;
      in its fixing position, the fixing device abuts against the mirror;
      the fixing element is movable from the operating position into the fixing position by changing a pressure of the interior of the housing;
      the fixing element is movable from the fixing position to the operating position by changing the pressure of the interior of the housing;
      the fixing device has a gas volume sealed from the interior space of the housing;

the system further comprises a further component;

the further component is movable depending on a difference between the pressure of the interior of the housing and a pressure in the gas volume;

the further component has its movement coupled to the fixing element, or the further component is the fixing element; and the system is an EUV lithography system.

17. The system of claim 16, wherein the fixing device is configured to move the fixing element from the operating position to the fixing position when there is an increase in the pressure of the interior of the housing.

18. The system of claim 16, wherein the further component comprises a flexible membrane defining a wall region of a further housing in which the gas volume is located.

19. The system of claim 17, wherein the further component comprises a flexible membrane defining a wall region of a further housing in which the gas volume is located.

20. The optical arrangement of claim 1, wherein, in the fixing position, the fixing element is spatially separated from the stop face.

* * * * *

UNITED STATES PATENT AND TRADEMARK OFFICE
CERTIFICATE OF CORRECTION

PATENT NO. : 10,761,436 B2
APPLICATION NO. : 16/511154
DATED : September 1, 2020
INVENTOR(S) : Ralf Zweering et al.

It is certified that error appears in the above-identified patent and that said Letters Patent is hereby corrected as shown below:

In the Specification

Column 14, Line 21, delete "FIG. 2A,2B" and insert -- FIGS. 2A-2B --;

Column 15, Line 43, delete "$10^4$" and insert -- $10^{-1}$ --;

Column 21, Line 32, delete "electroheological" and insert -- electrorheological --.

Signed and Sealed this
Twentieth Day of October, 2020

Andrei Iancu
*Director of the United States Patent and Trademark Office*